(12) United States Patent
Lee et al.

(10) Patent No.: US 9,735,216 B2
(45) Date of Patent: Aug. 15, 2017

(54) ORGANIC LIGHT EMITTING DISPLAY DEVICE

(71) Applicant: LG DISPLAY CO., LTD., Seoul (KR)

(72) Inventors: Geum Young Lee, Incheon (KR); Ki Soub Yang, Paju-si (KR); Soo Yong Lee, Seoul (KR); Dae Jung Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/140,082

(22) Filed: Apr. 27, 2016

(65) Prior Publication Data

US 2016/0254332 A1 Sep. 1, 2016

Related U.S. Application Data

(63) Continuation of application No. 14/582,683, filed on Dec. 24, 2014, now Pat. No. 9,349,779.

(30) Foreign Application Priority Data

Sep. 22, 2014 (KR) .................. 10-2014-0126207

(51) Int. Cl.
*H01L 27/32* (2006.01)
*H01L 51/50* (2006.01)

(52) U.S. Cl.
CPC ........ *H01L 27/3246* (2013.01); *H01L 27/326* (2013.01); *H01L 27/3262* (2013.01); *H01L 27/3265* (2013.01); *H01L 51/5012* (2013.01); *H01L 2227/323* (2013.01)

(58) Field of Classification Search
CPC .......................... H01L 51/56; H01L 27/3246
See application file for complete search history.

(56) References Cited

U.S. PATENT DOCUMENTS

| | | | |
|---|---|---|---|
| 7,951,710 B2 * | 5/2011 | Fujii | H01L 27/1292 257/E21.174 |
| 8,581,273 B2 | 11/2013 | Takei | |
| 9,349,779 B2 * | 5/2016 | Lee | H01L 27/326 |
| 2007/0098879 A1 * | 5/2007 | Makiura | H01L 51/5088 427/66 |
| 2008/0315428 A1 | 12/2008 | Fujii | |

FOREIGN PATENT DOCUMENTS

| | | |
|---|---|---|
| CN | 1622706 A | 6/2005 |
| CN | 103839963 A | 6/2014 |
| CN | 103839965 A | 6/2014 |
| CN | 103840090 A | 6/2014 |
| CN | 103915446 A | 7/2014 |
| TW | 201248966 A | 12/2012 |

* cited by examiner

*Primary Examiner* — William Coleman
(74) *Attorney, Agent, or Firm* — Dentons US LLP

(57) ABSTRACT

An organic light emitting display (OLED) device is disclosed. The OLED device includes a substrate configured to include a sub-pixel defined into an emission region and a driving region. A first bank pattern configured to define the emission region of the sub-pixel is formed on the substrate. A second bank pattern configured to include an opening, which exposes the emission region and a part of the driving region, is formed on a part of an upper surface of the first bank pattern. An organic emission layer is formed in the opening. As such, the occupied area of the organic emission layer becomes wider. Therefore, the thickness deviation of the organic emission layer is prevented or minimized.

16 Claims, 6 Drawing Sheets

ORGANIC LIGHT EMITTING DISPLAY DEVICE

The present application is a continuation of U.S. patent application Ser. No. 14/582,683 filed Dec. 24, 2014, now allowed, which claims priority under 35 U.S.C. §119(a) of Korean Patent Application No. 10-2014-0126207 filed on Sep. 22, 2014, both of which are hereby incorporated by reference in its entirety.

BACKGROUND

Field of the Disclosure

The present application relates to an organic light emitting display (OLED) device. More particularly, the present application relates to an OLED device adapted to prevent the generation of a thickness deviation and to a manufacturing method thereof.

Description of the Related Art

Nowadays, display devices have been rapidly developed with the advancement of information communication. Among the display devices, an OLED device using a self-luminous element does not require a separate backlight unit. In accordance therewith, the OLED device has features of being thinner and lower power consumption compared to the other display devices.

In general, an organic light emitting element used in the OLED device can include an anode electrode, a cathode electrode and an organic emission layer interposed between the two electrodes. Such an organic light emitting element enables generates excitons by recombining holes and electrons from the anode and cathode electrodes into the organic emission layer. Also, the organic light emitting element emits light by the excitons transitioning from an excited state to a stable state.

The organic emission layer has been mainly formed using a vapor deposition method. Recently, an ink-jet printing process is being used to form the organic emission layer on a large-sized substrate.

The ink-jet printing process feeds nozzles along a horizontal direction of sub-pixels and drops a liquefied organic emission material into each of the sub-pixels through the nozzles. However, it is difficult to secure enough nozzles opposite to a single sub-pixel due to the structure of the OLED device. Due to this, if at least one of the nozzles shows an abnormality at the formation of the organic emission layer, thickness deviations of the organic emission layer must be generated.

The thickness deviation of the organic emission layer can cause a stain within a sub-pixel. Moreover, if the organic emission layer is applied to a high definition OLED device, the number of nozzles necessary to form the organic emission layer into each sub-pixel must be reduced more. For this reason, the thickness deviation of the organic emission layer must be very sensitive to an abnormal nozzle.

BRIEF SUMMARY

Accordingly, embodiments of the present application are directed to an OLED device that substantially obviates one or more of problems due to the limitations and disadvantages of the related art, as well to a method of manufacturing the same.

The embodiments provide a display device and a manufacturing method thereof which are adapted to prevent or minimize thickness deviation of an organic emission layer by forming additional bank pattern with an opening which exposes a part of a driving domain within a sub-pixel region.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

An OLED device according to a general aspect of the present embodiment includes a substrate configured to include a sub-pixel defined into an emission region and a driving region. A first bank pattern configured to define the emission region of the sub-pixel is formed on the substrate. A second bank pattern configured to include an opening, which exposes the emission region and a part of the driving region, is formed on a part of an upper surface of the first bank pattern. An organic emission layer is formed in the opening. As such, the occupation area of the organic emission layer becomes wider. Therefore, the thickness deviation of the organic emission layer is prevented or minimized.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
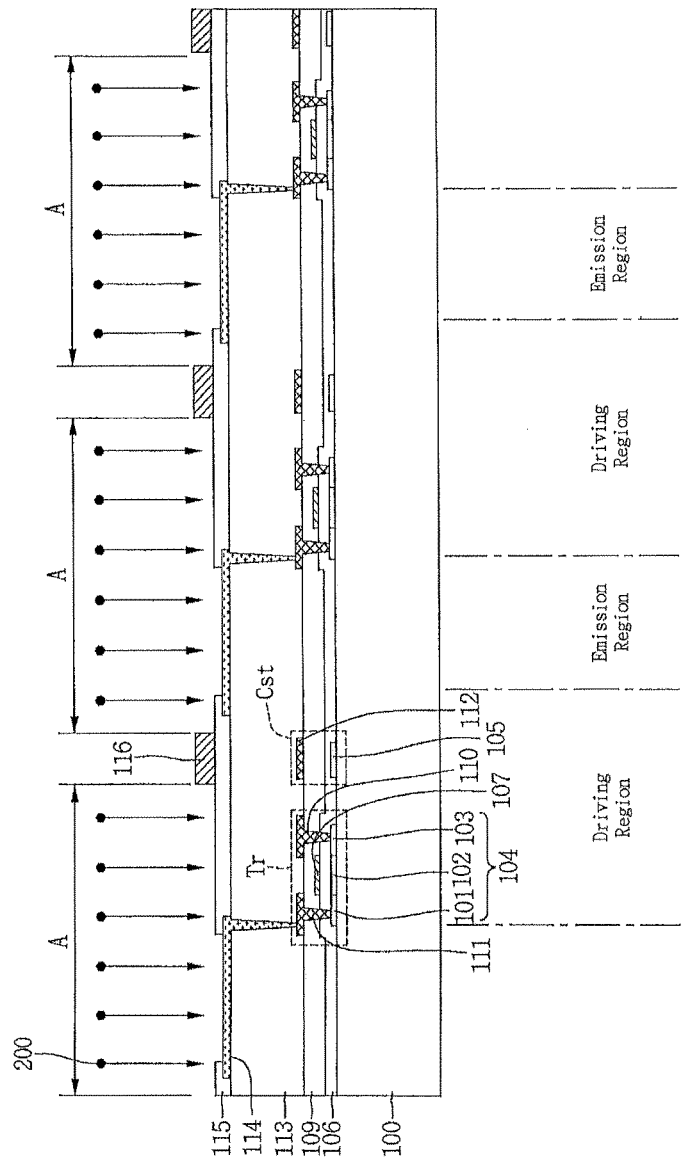
FIG. 1 is a cross-sectional view showing an OLED device according to a first embodiment of the present disclosure.

Reference will now be made in detail to embodiments of the present disclosure, examples of which are illustrated in the accompanying drawings. These embodiments introduced hereinafter are provided as examples in order to convey the spirit of the invention to the ordinary skilled person in the art. Therefore, the embodiments may be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a cross-sectional view showing an OLED device according to a first embodiment of the present disclosure. Referring to FIG. 1, the OLED device according to a first embodiment of the present disclosure includes a substrate 100 provided with a plurality of sub-pixels which is used to display an image. The sub-pixel can be defined into an emission region and a driving region prepared to drive the emission region. The OLED device includes an organic light emitting element formed in the emission region of the sub-pixel region. Also, the OLED device includes a thin film transistor Tr and a capacitor Cst which are formed in the driving region of the sub-pixel region.

The organic light emitting element includes first electrode 114. Also, the organic light emitting element includes a second electrode and an organic emission layer which are not shown in the drawing. The second electrode is disposed opposite to the first electrode 114. The organic emission layer is formed between the first electrode 114 and the second electrode.

The thin film transistor Tr includes a semiconductor layer 104, a gate insulation film 106, a gate electrode 107, a source electrode 110 and a drain electrode 111 which are sequentially formed on the substrate 100. The capacitor Cst includes a capacitor electrode 112 and another semiconductor layer 105 disposed thereunder.

In detail, the semiconductor layer 104 of the thin film transistor Tr and the semiconductor layer 105 of the capacitor Cst are formed on the substrate 100. The semiconductor layer 104 of the thin film transistor Tr includes a drain region 101, a channel region 102 and a source region 103.

The gate insulation film 106 is formed on the substrate 100 in such a manner as to cover the semiconductor layers 104 and 105. The gate electrode 107 is formed on the gate insulation film 106 opposite to the channel region 102 of the semiconductor layer 104 of the thin film transistor Tr. Such a gate electrode 107 can be formed from one of copper Cu, silver Ag, aluminum Al, chromium Cr, titanium Ti, tantalum Ta, molybdenum Mo and alloys thereof. Although the gate electrode 107 is formed to have a single metal layer as shown in the drawing, the gate electrode 107 can be formed by stacking at least two metal layers as needed.

An interlayer insulation film 109 is formed on the entire surface of the substrate 100 provided with the gate electrode 107. Primary contact holes are formed in the interlayer insulation film 109 and the gate insulation film 106. The primary contact holes expose the drain region 101 and the source region 103.

Thereafter, the source electrode 110 and drain electrode 111 being separated from each other are formed on a part of the interlayer insulation film 109 provided with the primary contact holes. The source electrode 110 and the drain electrode 111 are connected to the source region 103 and the drain region 101 of the thin film transistor Tr through the primary contact holes. At the same time, the capacitor electrode 112 is also formed on the interlayer insulation film 109 opposite to the semiconductor layer 105 of the capacitor Cst. The capacitor electrode 112 can be formed from the same material as the source and drain electrodes 110 and 111.

The source electrode 110, the drain electrode 111 and the capacitor electrode 112 can be formed from one of copper Cu, silver Ag, aluminum Al, chromium Cr, titanium Ti, tantalum Ta, molybdenum Mo and alloys thereof. Although the source electrode 110, the drain electrode 111 and the capacitor electrode 112 are formed to have a single metal layer as shown in the drawing, they can be formed by stacking at least two metal layers as needed.

In this manner, the thin film transistor Tr and the capacitor Cst are formed on the substrate 100. A region being occupied by the thin film transistor Tr and the capacitor Cst can be defined as the driving region.

A planarization film 113 is formed on the entire surface of the substrate 100 provided with the thin film transistor Tr and the capacitor Cst. The planarization film 113 is used to planarize an uneven surface of the substrate 100 caused by the thin film transistor Tr.

Although not shown in the drawing, a passivation film can further be formed on the entire surface of the substrate 100 provided with the thin film transistor Tr and the capacitor Cst before the formation of the planarization film 113. The passivation film can be used to protect the source electrode 110, the drain electrode 111 and the capacitor electrode 112.

A secondary contact hole exposing the drain electrode 111 of the thin film transistor Tr is formed in the planarization film 113. The first electrode 114 of the organic light emitting element is formed on a part of an upper surface of the planarization film 113. The first electrode 114 is connected to the drain electrode 111 through the secondary contact hole.

The first electrode 114 can be used as an anode electrode, but it is not limited to this. In other words, the first electrode 114 can be used as a cathode electrode. As an example, the first electrode 114 used as the anode electrode will now be described.

Such a first electrode 114 can be formed in a single layer and from a transparent conductive material with a relatively high work function. As such, a bottom emission mode OLED device emitting light in a downward direction of the first electrode 114 can be implemented.

Alternatively, the OLED device can further include a reflective layer disposed under the first electrode 114. In this case, a top emission mode OLED device emitting light in an upward direction of the first electrode 114 can be implemented. The reflective layer reflects light received through the first electrode 114 toward an upward direction of the first electrode 114.

However, the first electrode 114 is not limited to the structure shown in the drawing. Alternatively, the first electrode 114 can be formed in a multi-layered structure. For example, the first electrode 114 can be formed in a triple layered structure including sequentially stacked first through third layers.

The first layer and the third layer can be formed from a transparent conductive material. The transparent conductive material can be one of indium-tin-oxide ITO and indium-zinc-oxide IZO. The second layer can be a reflective layer. In this case, the second layer can be formed from one of a metal and a metal alloy. For example, the second electrode can be formed from one of silver Ag and an alloy containing silver Ag. Such a first electrode 114 reflects light progressing in the downward direction of the second electrode toward the upward direction of the second electrode. In accordance therewith, the top emission mode OLED device can be implemented.

A first bank pattern 115 can be formed on the planarization film 113 provided with the first electrode 114. The first bank pattern 115 can define the emission region of the sub-pixel. Also, the first bank pattern 115 can be formed in such a manner as to expose a part of the upper surface of the first electrode 114 corresponding to the emission region.

A second bank pattern 116 can be formed on a part of an upper surface of the first bank pattern 115. In detail, the second bank pattern 116 can be disposed in the driving region opposite to the capacitor Cst. The second bank pattern 116 can be formed to have a higher height (or a larger thickness) than that of the first bank layer 115. As such, a concentrated phenomenon of the organic emission layer toward a non-emission region can be prevented.

In accordance therewith, an opening exposing the emission region and a part of the driving region opposite to the thin film transistor Tr can be formed by means of the second bank pattern 116. For the convenience of explanation, the opening defined by the second bank pattern 116 will be referred to as a first opening A. In other words, the first opening A can expose the emission region and a part of the driving region which is prepared to drive the organic light emitting element disposed in the emission region.

An organic emission layer is disposed in the first opening A. In other words, the organic emission layer can be formed in such a manner as to cover the upper surface of the first bank pattern 115 and be surrounded by the second bank pattern 116.

The organic emission layer can be a single layer formed from an emission material. In order to enhance the luminous efficiency, the organic emission layer can be formed in a multi-layered structure. For example, the organic emission layer can include a hole injection layer, a hole transport layer, an emission material layer, an electron transport layer and an electron injection layer.

The organic emission layer can be formed using an ink-jet method which jets or drops a liquefied organic emission material on the first electrode 114 and hardens the jetted or dropped emission material. More specifically, the organic emission layer can be prepared by supplying the first opening A with a pixel pigment through nozzles of an ink head opposite to the sub-pixel. If the organic emission layer is formed using the liquefied organic emission material, a large-sized display device can be efficiently manufactured and the manufacture procedure of the large-sized display device can be simplified.

In this way, the nozzles of the ink head for supplying the liquefied organic emission material can be opposite to not only the emission region but also a part of the driving region which is prepared to drive the emission region. As such, a large quantity of organic emission material can be supplied to the sub-pixel. This results from the fact that the number of nozzles of the ink head opposite to the sub-pixel (i.e., the first opening A) increases. As such, the organic emission layer can be uniformly formed even though one of the nozzles of the ink head shows an abnormality.

The OLED device according to the present disclosure can increase the number of nozzles of the ink head opposite to each sub-pixel by forming an additional bank pattern (i.e., the second bank pattern) with the first opening A which exposes the emission region and a part of the driving region prepared with drive the emission region. The thickness deviation of the organic emission layer within the sub-pixel can be minimized even though one of the nozzles shows an abnormality in the jet of the liquefied organic emission material.

Figure 2:
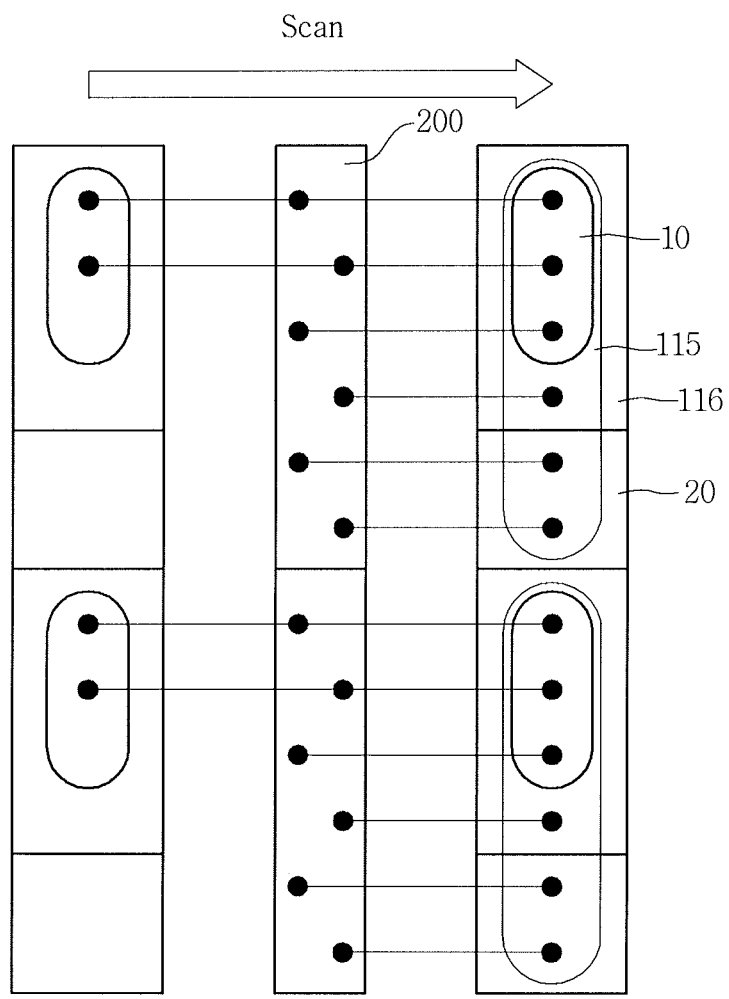
FIG. 2 is a planar view illustrating formation procedures of an organic emission layer according to a first embodiment of the present disclosure and a comparable embodiment.

FIG. 2 is a planar view illustrating formation procedures of an organic emission layer according to a first embodiment of the present disclosure and a comparable embodiment. As shown in FIG. 2, a nozzle portion 200 is disposed in the central region, sub-pixels of a comparative embodiment are arranged in the left side of the nozzle portion 200, and sub-pixels of the first embodiment are arranged in the right side of the nozzle portion.

Referring to FIG. 2, the sub-pixels of the OLED devices according to the comparative embodiment and the first embodiment can be defined into an emission region 10 prepared for the formation of an organic light emitting element, and a driving region 20 prepared for the formation of an thin film transistor and a capacitor.

Both of the first embodiment and the comparative embodiment allow a first bank pattern 115 surrounding the emission region 10 and covering the driving region 20. As such, the emission region 10 can be exposed in an elliptical shape by the first bank pattern 115. In other words, the first bank pattern 115 can be used to define the sub-pixel region into the emission region 10 and a non-emission region.

Unlike the comparative embodiment, the first embodiment further forms a second bank pattern 116 exposing a part of the first bank pattern 115 in an elliptical shape. The exposed first bank pattern 115 can occupy an adjacent region to the emission region 10 and a part of the driving region 20 which is prepared to drive an organic light emitting element on the emission region 10.

A pixel pigment for forming the organic emission layer can be supplied to a substrate with the bank pattern through the nozzle portion. In this time, the nozzle portion 200 used in the comparative embodiment must be opposite to only the emission region 10. On the other hand, the nozzle portion 200 used in the first embodiment can be opposite to not only the emission region 10 but also the driving region 20.

As such, the number of nozzles opposite to the sub-pixel of the first embodiment can become larger than the number of nozzles opposite to the sub-pixel of the comparative embodiment. In accordance therewith, the organic emission layer of the first embodiment can be more uniformly formed compared to that of the comparative embodiment when the nozzle portion 200 shows an abnormality.

Also, the OLED device of the present disclosure allows the sub-pixels to be arranged in a zigzag shape not a single line based on a horizontal axis. In this case, the pixel pigment can be supplied to the emission region 10 and the driving region 20 through different nozzles from each other. In accordance therewith, the quantity deviation of the pixel pigment within the emission region 10 and the driving region 20 can be minimized.

In this way, the OLED device according to a first embodiment of the present disclosure can form an additional bank pattern (i.e., the second bank pattern 116) exposing the emission region 10 and a part of the driving region 20 prepared for the emission region 10. As such, the number of nozzles of the ink head opposite to each sub-pixel can increase at the formation of the organic emission layer. In accordance therewith, a large quantity of organic emission material can be supplied to each of the sub-pixels through a single scan.

Figure 3:
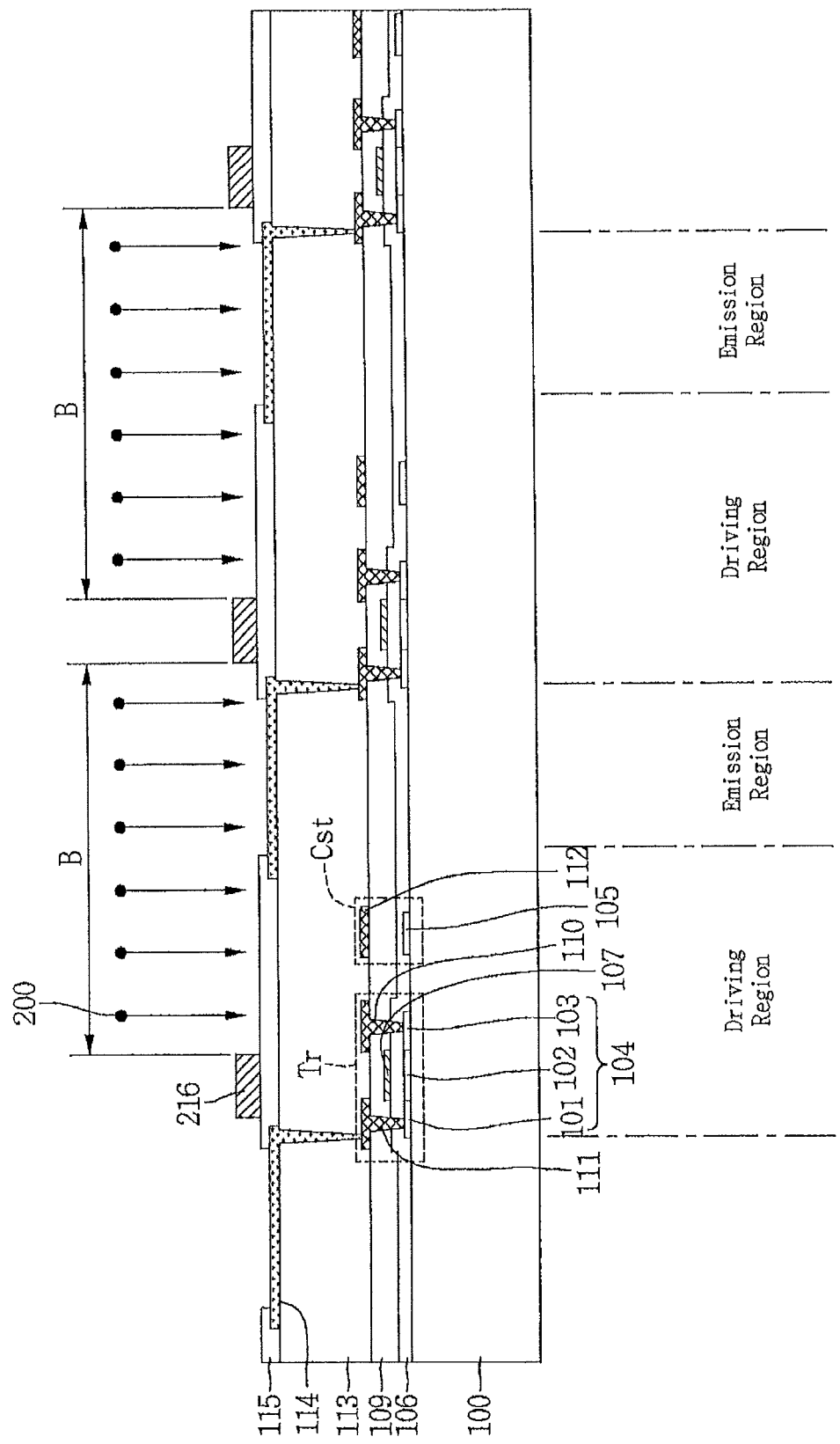
FIG. 3 is a cross-sectional view showing an OLED device according to a second embodiment of the present disclosure.

Subsequently, an OLED device according to a second embodiment of the present disclosure will be described with reference to FIG. 3. FIG. 3 is a cross-sectional view showing an OLED device according to a second embodiment of the present disclosure. The OLED display device of the second embodiment can include the same components as that of the previous embodiment. As such, components of the second embodiment having the same function and shape as those of the previous embodiment will be referred to by the same reference numbers and names. Also, the description of the second embodiment overlapping with the previous embodiment will be omitted.

Referring to FIG. 3, the OLED device according to a second embodiment of the present disclosure includes a substrate 100 provided with a plurality of sub-pixels regions which are used to display an image. The sub-pixel can be defined into an emission region and a driving region prepared to drive the emission region. The OLED device includes an organic light emitting element formed in the emission region of the sub-pixel. Also, the OLED device includes a thin film transistor Tr and a capacitor Cst which are formed in the driving region of the sub-pixel.

The thin film transistor Tr includes a semiconductor layer 104, a gate insulation film 106, a gate electrode 107, a source electrode 110 and a drain electrode 111 which are sequentially formed on the substrate 100. The capacitor Cst includes a capacitor electrode 112 and another semiconductor layer 105 disposed thereunder. The organic light emitting element includes first electrode 114. Also, the organic light emitting element includes a second electrode and an organic emission layer which are not shown in the drawing. The second electrode is disposed opposite to the first electrode 114. The organic emission layer is formed between the first electrode 114 and the second electrode.

More specifically, the semiconductor layer 104 of the thin film transistor Tr and the semiconductor layer 105 of the capacitor Cst are formed on the substrate 100. The semiconductor layer 104 of the thin film transistor Tr includes a drain region 101, a channel region 102 and a source region 103.

The gate insulation film 106 is formed on the substrate 100 in such a manner as to cover the semiconductor layers 104 and 105. The gate electrode 107 is formed on the gate insulation film 106 opposite to the channel region 102 of the semiconductor layer 104 of the thin film transistor Tr. Such a gate electrode 107 can be formed from one of copper Cu, silver Ag, aluminum Al, chromium Cr, titanium Ti, tantalum Ta, molybdenum Mo and alloys thereof. Although the gate electrode 107 is formed to have a single metal layer as shown in the drawing, the gate electrode 107 can be formed by stacking at least two metal layers as needed.

An interlayer insulation film 109 is formed on the entire surface of the substrate 100 provided with the gate electrode 107. Primary contact holes are formed in the interlayer insulation film 109 and the gate insulation film 106. The primary contact holes expose the drain region 101 and the source region 103.

Afterward, the source electrode 110 and drain electrode 111 being separated from each other are formed on a part of the interlayer insulation film 109 provided with the primary contact holes. The source electrode 110 and the drain electrode 111 are connected to the source region 103 and the drain region 101 of the thin film transistor Tr through the primary contact holes. At the same time, the capacitor electrode 112 is also formed on the interlayer insulation film 109 opposite to the semiconductor layer 105 of the capacitor Cst. The capacitor electrode 112 can be formed from the same material as the source and drain electrodes 110 and 111.

The source electrode 110, the drain electrode 111 and the capacitor electrode 112 can be formed from one of copper Cu, silver Ag, aluminum Al, chromium Cr, titanium Ti, tantalum Ta, molybdenum Mo and alloys thereof. Although the source electrode 110, the drain electrode 111 and the capacitor electrode 112 are formed to have a single metal layer as shown in the drawing, they can be formed by stacking at least two metal layers as needed. In this manner, the thin film transistor Tr and the capacitor Cst are formed on the substrate 100.

A planarization film 113 is formed on the entire surface of the substrate 100 provided with the thin film transistor Tr and the capacitor Cst. A secondary contact hole exposing the drain electrode 111 of the thin film transistor Tr is formed in the planarization film 113. The first electrode 114 of the organic light emitting element is formed on a part of an upper surface of the planarization film 113. The first electrode 114 is connected to the drain electrode 111 through the secondary contact hole.

The first electrode 114 can be used as an anode electrode. Such a first electrode 114 can be formed in a single layer and from a transparent conductive material with a relatively high work function. As such, a bottom emission mode OLED device emitting light in a downward direction of the first electrode 114 can be implemented.

Alternatively, the OLED device can further include a reflective layer disposed under the first electrode 114. In this case, a top emission mode OLED device emitting light in an upward direction of the first electrode 114 can be implemented. The reflective layer reflects light received through the first electrode 114 toward an upward direction of the first electrode 114.

However, the first electrode 114 is not limited to the structure shown in the drawing. Alternatively, the first electrode 114 can be formed in a multi-layered structure. For example, the first electrode 114 can be formed in a triple layered structure including sequentially stacked first through third layers.

The first layer and the third layer can be formed from a transparent conductive material. The transparent conductive material can be one of indium-tin-oxide ITO and indium-zinc-oxide IZO. The second layer can be a reflective layer. As such, the first electrode 114 reflects light progressing in the downward direction of the second electrode toward the upward direction of the second electrode. In accordance therewith, the top emission mode OLED device can be implemented.

A first bank pattern 115 can be formed on the planarization film 113 provided with the first electrode 114. The first bank pattern 115 can define the emission region and a non-emission region of the sub-pixel. Also, the first bank pattern 115 can is formed in such a manner as to expose a part of the upper surface of the first electrode 114 corresponding to the emission region 10.

A second bank pattern 216 can be formed on a part of an upper surface of the first bank pattern 115. In detail, the second bank pattern 216 can be disposed in the driving region opposite to the thin film transistor Tr. The second bank pattern 216 can be formed to have a higher height (or a larger thickness) than that of the first bank layer 115.

In accordance therewith, an opening exposing the upper surface of the first electrode 114 within the emission region and a part of the driving region opposite to the thin film transistor Tr can be formed by means of the second bank pattern 216. For the convenience of explanation, the opening defined by the second bank pattern 216 will be referred to as a second opening B.

In detail, the second opening B can expose the emission region and a part of the driving region opposite to the capacitor Cst. In other words, the second opening B can expose a single emission region and a part of an adjacent driving region thereto which is prepared to drive a different emission region.

An organic emission layer is disposed into the second opening B. In other words, the organic emission layer can be formed in such a manner as to cover the upper surface of the first bank pattern 115 and be surrounded by the second bank pattern 216.

The organic emission layer can be a single layer formed from an emission material. In order to enhance the luminous efficiency, the organic emission layer can be formed in a multi-layered structure. For example, the organic emission layer can include a hole injection layer, a hole transport layer, an emission material layer, an electron transport layer and an electron injection layer.

The organic emission layer can be formed using an ink-jet method which jets or drops a liquefied organic emission material on the first electrode 114 and then hardens the jetted or dropped emission material. More specifically, the organic emission layer can be formed by supplying the second opening B with a pixel pigment through nozzles of an ink head opposite to the sub-pixel.

In this way, the nozzles of the ink head for supplying the liquefied organic emission material can be opposite to not only the emission region of the respective sub-pixel but also a part of the driving region of a different sub-pixel adjacent thereto. As such, a large quantity of organic emission material can be supplied to each of the sub-pixels through a single scan when the liquefied organic emission material is dropped on the pixel region.

The OLED device according to the present disclosure can increase the number of nozzles of the ink head opposite to each sub-pixel by forming an additional bank pattern (i.e., the second bank pattern) with the second opening B which exposes the emission region and a part of the driving region prepared with drive the emission region. In accordance therewith, the thickness deviation of the organic emission layer within the sub-pixel can be minimized even though one of the nozzles shows an abnormality in the jet of the liquefied organic emission material.

Figure 4:
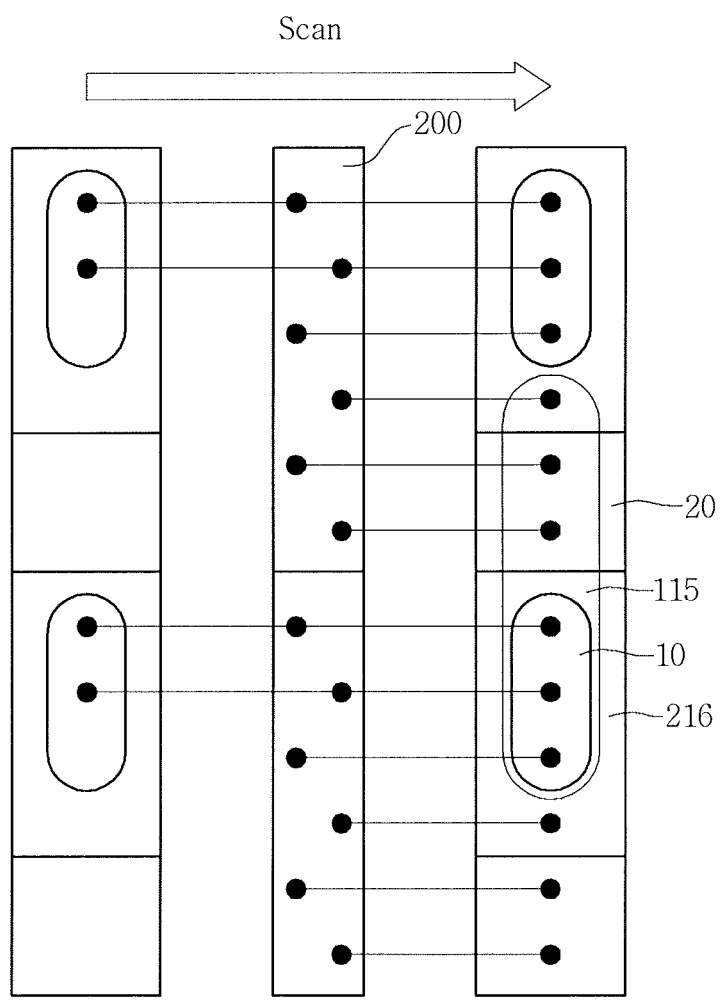
FIG. 4 is a planar view illustrating formation procedures of an organic emission layer according to a second embodiment of the present disclosure and a comparable embodiment.

Also, a procedure of forming an organic emission layer according to a second embodiment of the present disclosure will be described with reference to FIG. 4. FIG. 4 is a planar view illustrating formation procedures of an organic emission layer according to a second embodiment of the present disclosure and a comparable embodiment. As shown in FIG. 4, a nozzle portion 200 is disposed in the central region, sub-pixels of a comparative embodiment are arranged in the left side of the nozzle portion 200, and sub-pixels of the second embodiment are arranged in the right side of the nozzle portion.

Referring to FIG. 4, the sub-pixels of the OLED devices according to the comparative embodiment and the second embodiment can be defined into an emission region 10 prepared for the formation of an organic light emitting element, and a driving region 20 prepared for the formation of an thin film transistor and a capacitor.

Both of the second embodiment and the comparative embodiment allow a first bank pattern surrounding the emission region 10 and covering the driving region 20 to be formed on each of the sub-pixels. As such, the emission region 10 can be exposed in an elliptical shape by the first bank pattern 115. In other words, the first bank pattern 115 can be used to define the sub-pixel region into the emission region 10 and a non-emission region.

Unlike the comparative embodiment, the second embodiment further forms a second bank pattern 216 exposing a part of the first bank pattern 115 in an elliptical shape. The exposed first bank pattern 115 can occupy an adjacent region to the emission region 10 of the respective sub-pixel. Also, the exposed first bank pattern 115 can occupy a part of the driving region 20 which is formed adjacently to the emission region 10 of the respective sub-pixel and prepared to drive the emission region 10 of a different sub-pixel.

A pixel pigment for forming the organic emission layer can be supplied to a substrate with the bank pattern through the nozzle portion. In this case, the nozzle portion 200 used in the comparative embodiment must be opposite to only the emission region 10. On the other hand, the nozzle portion 200 used in the second embodiment can be opposite to not only the emission region 10 of the respective sub-pixel but also an adjacent driving region 20 thereto which is prepared to drive the emission region 10 of another sub-pixel.

As such, the number of nozzles opposite to the sub-pixel of the second embodiment can become larger than the number of nozzles opposite to the sub-pixel of the comparative embodiment. In accordance therewith, the organic emission layer of the second embodiment can be more uniformly formed compared to that of the comparative embodiment when the nozzle portion 200 shows an abnormality.

In this way, the OLED device according to a second embodiment of the present disclosure can form an additional bank pattern (i.e., the second bank pattern 216) exposing the emission region 10 of the respective sub-pixel and a part of an adjacent driving region 20 thereto which is prepared for the emission region 10 of another sub-pixel. As such, the number of nozzles of the ink head opposite to each sub-pixel can increase at the formation of the organic emission layer. In accordance therewith, a large quantity of organic emission material can be supplied to each of the sub-pixels through a single scan.

Figure 5:
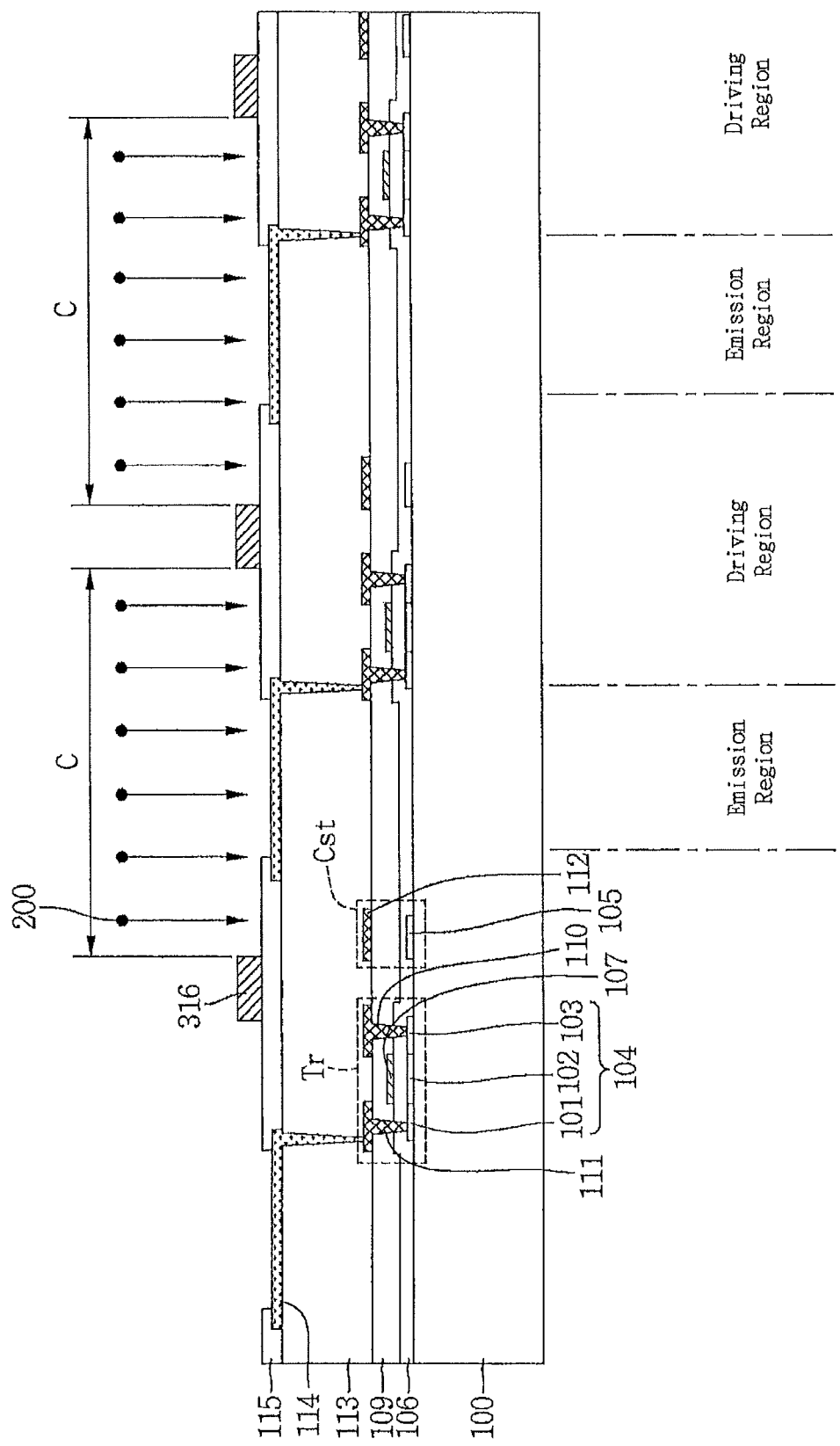
FIG. 5 is a cross-sectional view showing an OLED device according to a third embodiment of the present disclosure.

Next, an OLED device according to a third embodiment of the present disclosure will be described with reference to FIG. 5. FIG. 5 is a cross-sectional view showing an OLED device according to a third embodiment of the present disclosure. The OLED display device of the third embodiment can include the same components as that of the previous embodiment. As such, components of the third embodiment having the same function and shape as those of the previous embodiment will be referred to by the same reference numbers and names. Also, the description of the third embodiment overlapping with the previous embodiment will be omitted.

Referring to FIG. 5, the OLED device according to a third embodiment of the present disclosure includes a substrate 100 provided with a plurality of sub-pixels which is used to display an image. The sub-pixel can be defined into an emission region and a driving region prepared to drive the emission region. The OLED device includes an organic light emitting element formed in the emission region of the sub-pixel region. Also, the OLED device includes a thin film transistor Tr and a capacitor Cst which are formed in the driving region of the sub-pixel region.

The thin film transistor Tr includes a semiconductor layer 104, a gate insulation film 106, a gate electrode 107, a source electrode 110 and a drain electrode 111 which are sequentially formed on the substrate 100. The capacitor Cst includes a capacitor electrode 112 and another semiconductor layer 105 disposed thereunder. The organic light emitting element includes first electrode 114. Also, the organic light emitting element includes a second electrode and an organic emission layer which are not shown in the drawing. The second electrode is disposed opposite to the first electrode 114. The organic emission layer is formed between the first electrode 114 and the second electrode. The detailed description for the structures of the thin film transistor Tr and the capacitor Cst will be omitted.

A planarization film 113 is formed on the entire surface of the substrate 100 provided with the thin film transistor Tr and the capacitor Cst. A secondary contact hole exposing the drain electrode 111 of the thin film transistor Tr is formed in the planarization film 113. The first electrode 114 of the organic light emitting element is formed on a part of an upper surface of the planarization film 113. The first electrode 114 is connected to the drain electrode 111 through the secondary contact hole.

The first electrode 114 can be used as an anode electrode. Such a first electrode 114 can be formed in a single layer and from a transparent conductive material with a relatively high work function. As such, a bottom emission mode OLED device emitting light in a downward direction of the first electrode 114 can be implemented.

Alternatively, the OLED device can further include a reflective layer disposed under the first electrode 114. In this case, a top emission mode OLED device emitting light in an upward direction of the first electrode 114 can be implemented. The reflective layer reflects light received through the first electrode 114 toward an upward direction of the first electrode 114. However, the first electrode 114 is not limited to the structure shown in the drawing. Alternatively, the first electrode 114 can be formed in a multi-layered structure.

A first bank pattern 115 can be formed on the planarization film 113 provided with the first electrode 114. The first bank pattern 115 can define the emission region and a non-emission region of the sub-pixel. Also, the first bank pattern 115 can be formed in such a manner as to expose a part of the upper surface of the first electrode 114 corresponding to the emission region 10.

A second bank pattern 316 can be formed on a part of an upper surface of the first bank pattern 115. In detail, the second bank pattern 316 can be formed to have a higher height (or a larger thickness) than that of the first bank layer 115. The second bank pattern 116 can be disposed in the driving region opposite to an intermediate region between the thin film transistor Tr and the capacitor Cst.

In accordance therewith, an opening exposing the emission region 10 and a part of the driving region 20 opposite to the thin film transistor Tr and the capacitor Cst, by means of the second bank pattern 316. For the convenience of explanation, the opening defined by the second bank pattern 316 will be referred to as a third opening C.

In detail, the third opening C can expose a single emission region. The third opening C can also expose a part of a driving region prepared to drive the emission region and a part of another driving region adjacent to the emission region.

An organic emission layer is disposed into the third opening C. In other words, the organic emission layer can be formed in such a manner as to cover the upper surface of the first bank pattern 115 and be surrounded by the second bank pattern 316.

The organic emission layer can be a single layer formed from an emission material. In order to enhance the luminous efficiency, the organic emission layer can be formed in a multi-layered structure. For example, the organic emission layer can include a hole injection layer, a hole transport layer, an emission material layer, an electron transport layer and an electron injection layer.

The organic emission layer can be formed using an ink-jet method which jets or drops a liquefied organic emission material on the first electrode 114 and then hardens the jetted or dropped emission material. More specifically, the organic emission layer can be formed by supplying the second opening B with a pixel pigment through nozzles of an ink head opposite to the sub-pixel.

In this way, the nozzles of the ink head for supplying the liquefied organic emission material can be opposite to not only the emission region of the respective sub-pixel but also a part of a driving region prepared to drive the emission region of the respective sub-pixel and a part of another driving region which is formed adjacently to the emission region of the respective sub-pixel and prepared to drive the driving region of a different sub-pixel. As such, a large quantity of organic emission material can be supplied to each of the sub-pixels through a single scan when the liquefied organic emission material is dropped on the pixel region. Also, the number of nozzles of the ink head opposite to each sub-pixel can increase. In accordance therewith, the thickness deviation of the organic emission layer within the sub-pixel can be minimized even though one of the nozzles shows an abnormality in the jet of the liquefied organic emission material.

Figure 6:
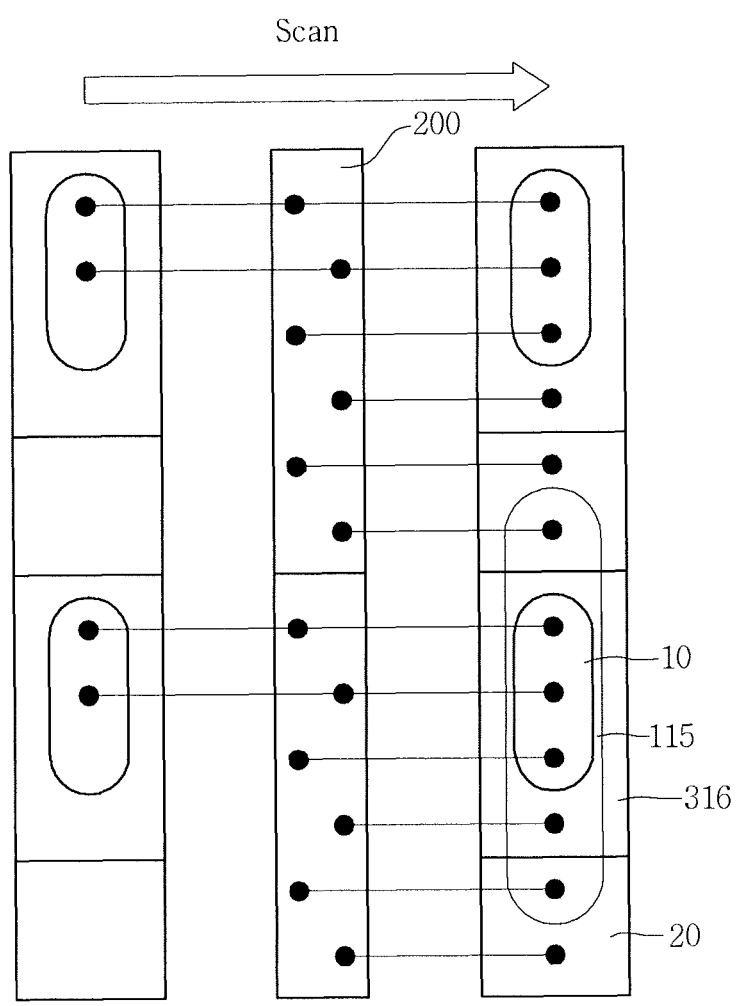
FIG. 6 is a planar view illustrating formation procedures of an organic emission layer according to a third embodiment of the present disclosure and a comparable embodiment.

Continuously, a procedure of manufacturing an organic emission layer according to a third embodiment of the present disclosure will be described with reference to FIG. 6. FIG. 6 is a planar view illustrating formation procedures of an organic emission layer according to a third embodiment of the present disclosure and a comparable embodiment. As shown in FIG. 6, a nozzle portion 200 is disposed in the central region, sub-pixels of a comparative embodiment are arranged in the left side of the nozzle portion 200, and sub-pixels of the third embodiment are arranged in the right side of the nozzle portion.

Referring to FIG. 6, the sub-pixels of the OLED devices according to the comparative embodiment and the third embodiment can be defined into an emission region 10 prepared for the formation of an organic light emitting element, and a driving region 20 prepared for the formation of an thin film transistor and a capacitor.

Both of the third embodiment and the comparative embodiment allow a first bank pattern 115 surrounding the emission region 10 and covering the driving region 20 to be formed on each of the sub-pixels. As such, the emission region 10 can be exposed in an elliptical shape by the first bank pattern 115. In other words, the first bank pattern 115 can be used to define the sub-pixel region into the emission region 10 and a non-emission region.

Unlike the comparative embodiment, the third embodiment further forms a second bank pattern 316 exposing a part of the first bank pattern 115 in an elliptical shape. The exposed first bank pattern 115 can occupy an adjacent region to the emission region 10 of the respective sub-pixel. Also, the exposed first bank pattern 115 can occupy a part of a driving region 20, which is prepared to drive the emission region 10 of the respective sub-pixel, and an adjacent region thereto. Moreover, the exposed first bank pattern 115 can occupy a part of another driving region 20, which is prepared to drive the emission region 10 of a different sub-pixel, and an adjacent region thereto.

A pixel pigment for forming the organic emission layer can be supplied to a substrate with the bank pattern through the nozzle portion. In this case, the nozzle portion 200 used in the comparative embodiment must be opposite to only the emission region 10. On the other hand, the nozzle portion 200 used in the third embodiment can be opposite to not only the emission region 10 of the respective sub-pixel but also a driving region 20 prepared to drive the emission region of the respective sub-pixel and another driving region prepared to drive the emission region 10 of a different sub-pixel.

As such, the number of nozzles opposite to the sub-pixel of the third embodiment can become larger than the number of nozzles opposite to the sub-pixel of the comparative embodiment. In accordance therewith, the organic emission layer of the second embodiment can be more uniformly formed compared to that of the comparative embodiment when the nozzle portion 200 shows an abnormality.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. An organic light emitting display device comprising:
   a substrate configured to include a sub-pixel defined into an emission region and a driving region;
   a first bank pattern disposed on the substrate and configured to define the emission region of the sub-pixel;
   a second bank pattern disposed on a part of an upper surface of the first bank pattern and configured to include an opening which exposes the emission region and a part of the driving region; and
   an organic emission layer disposed in the opening,
   wherein the opening is wider than the emission region.

2. The organic light emitting display device of claim 1, wherein the second bank pattern has a larger height than that of the first bank pattern.

3. The organic light emitting display device of claim 1, wherein the second bank pattern is disposed in the driving region opposite to a capacitor.

4. The organic light emitting display device of claim 1, wherein the opening exposes the emission region and the driving region opposite to a thin film transistor.

5. The organic light emitting display device of claim 1, wherein the second bank pattern is disposed in the driving region opposite to a thin film transistor.

6. The organic light emitting display device of claim 1, wherein the opening exposes the emission region and the driving region opposite to a capacitor.

7. The organic light emitting display device of claim 1, wherein the second bank pattern is disposed in the driving region opposite to an intermediate region between a thin film transistor and a capacitor.

8. The organic light emitting display device of claim 1, wherein the opening exposes the emission region and the driving region opposite to a thin film transistor and a capacitor.

9. The organic light emitting display device of claim 1, wherein the organic emission layer consists of liquefied organic emission material.

10. The organic light emitting display device of claim 1, wherein the opening exposes the emission region and the driving region opposite to a thin film transistor and an intermediate region between the thin film transistor and a capacitor.

11. An organic light emitting display device comprising:
    a substrate configured to include a sub-pixel defined into an emission region and a driving region;
    a first bank pattern disposed on the substrate and configured to define the emission region of the sub-pixel;
    a second bank pattern disposed on one side of the first bank pattern to define an opening that is larger than the emission region to surround the emission region and a part of the driving region;
    an organic emission layer disposed in the opening to cover a part of an upper surface of the first bank pattern.

12. The organic light emitting display device of claim 11, wherein the second bank pattern is disposed on a left side to the center of the first bank pattern.

13. The organic light emitting display device of claim 11, wherein the second bank pattern is disposed on a right side to the center of the first bank pattern.

14. The organic light emitting display device of claim 1, wherein the second bank pattern is disposed in the driving region opposite to a capacitor.

15. The organic light emitting display device of claim 11, wherein the second bank pattern is disposed in the driving region opposite to a thin film transistor.

16. The organic light emitting display device of claim 11, wherein the second bank pattern is disposed in the driving region opposite to an intermediate region between a thin film transistor and a capacitor.

\* \* \* \* \*